(12) United States Patent
Qamhiyah et al.

(10) Patent No.: US 7,778,995 B2
(45) Date of Patent: Aug. 17, 2010

(54) GEOMETRIC SEARCH ENGINE

(75) Inventors: Abir Ziyad Qamhiyah, Ames, IA (US); Donald Flugrad, Ames, IA (US)

(73) Assignee: Iowa State University Research Foundation, Inc., Ames, IA (US)

( * ) Notice: Subject to any disclaimer, the term of this patent is extended or adjusted under 35 U.S.C. 154(b) by 336 days.

(21) Appl. No.: 11/737,520

(22) Filed: Apr. 19, 2007

(65) Prior Publication Data
US 2007/0192302 A1 Aug. 16, 2007

Related U.S. Application Data

(62) Division of application No. 10/883,001, filed on Jun. 30, 2004, now Pat. No. 7,548,650.

(51) Int. Cl.
*G06F 7/00* (2006.01)
*G06F 17/00* (2006.01)
*G06F 17/30* (2006.01)

(52) U.S. Cl. .................. 707/706; 707/741; 707/703; 707/782

(58) Field of Classification Search ............... 707/706, 707/741, 703, 782
See application file for complete search history.

(56) References Cited

U.S. PATENT DOCUMENTS

| | | | |
|---|---|---|---|
| 6,377,148 B1 | 4/2002 | Forbes et al. | |
| 6,397,117 B1 | 5/2002 | Burrows et al. | |
| 6,516,277 B2 | 2/2003 | Edgecombe et al. | |
| 6,522,910 B1 | 2/2003 | Gregory | |
| 6,625,607 B1 * | 9/2003 | Gear et al. | 1/1 |
| 6,627,835 B1 | 9/2003 | Chung et al. | |
| 6,629,093 B1 | 9/2003 | Davis et al. | |
| 6,839,842 B1 * | 1/2005 | Iverson et al. | 713/176 |
| 2004/0060018 A1 * | 3/2004 | Tran et al. | 716/4 |
| 2004/0236561 A1 | 11/2004 | Smith et al. | |
| 2004/0249809 A1 * | 12/2004 | Ramani et al. | 707/4 |
| 2004/0252832 A1 | 12/2004 | Domjan et al. | |
| 2004/0252889 A1 | 12/2004 | Liu et al. | |
| 2005/0232511 A1 | 10/2005 | Ziou et al. | |

OTHER PUBLICATIONS

Bustos et al., "Feature-Based Similarity Search in 3D Object Databases" *ACM Computing Surveys*, vol. 37, No. 4, Dec. 2005, pp. 345-387.

SMI 2004: Genova, Italy, "2004 International Conference on Shape Modeling and Applications" Jun. 7-9, 2004 http://www.informatik.uni-trier.de/~lev/db/conf/smi/smi2004.html, printed from internet on Apr. 21, 2006, 2 pages.

(Continued)

*Primary Examiner*—Khanh B Pham
*Assistant Examiner*—Van H Oberly
(74) *Attorney, Agent, or Firm*—Fish & Richardson P.C.

(57) ABSTRACT

One implementation provides a method to provide information associated with a previously designed component having a geometry that is similar to a geometry of a source component. In this implementation, the method includes obtaining a first set of coefficients for a non-invertible representation of the geometry of the source component, and comparing the first set of coefficients to a second set of coefficients for a non-invertible representation of the geometry of the previously designed component. If the first set of coefficients matches the second set of coefficients according to a threshold of similarity, the method further includes providing a search result associated with the previously designed component.

43 Claims, 10 Drawing Sheets

OTHER PUBLICATIONS

Tangelder et al., "A Survey of Content Based 3D Shape Retrieval Methods" *Institute of Information and Computing Sciences, Utrecht University.*

Funkhouser et al., "Shape-Based Retrieval and Analysis of 3D Models" Jun. 2005/vol. 48 , No. 6 *Communications of the ACM.*

Berchtold et al., "Using extended feature objects for partial similarity retrieval" *The VLDB Journal* (1997) 6: 333-348.

Jagadish, H.V. "A Retrieval Technique for Similar Shapes" *AT&T Bell Laboratories* pp. 208-217.

Kazman et al., "Information Organization in Multimedia Resources" 1993 ACM pp. 149-162.

Cybenko et al., "Pattern Recognition of 3D CAD Objects: Towards an Electronic Yellow Pages of Mechanical Parts" *Smart Engineering Systems Design*, vol. 1, pp. 1-13, 1997.

Bozkaya et al., "Indexing Large Metric Spaces for Similarity Search Queries" *ACM Transactions on Database Systems*, vol. 24, No. 3, Sep. 1999, pp. 361-404.

Shum et al., "On 3D Shape Similarity" *The Robotics Institute Carnegie Mellon University* Pittsburgh, PA pp. 526-531.

Office Action dated Jun. 13, 2008, for U.S. Appl. No. 10/883,001.

Office Action dated Apr. 7, 2008, for U.S. Appl. No. 10/883,021.

Funkhouser et al., "Modeling by Example," *ACM Transactions on Graphics*, 2004, Los Angeles, CA, 12 pages.

Funkhouser et al., "A Search Engine for 3D Models," *ACM Transactions on Graphics*, 2003, 22(1):83-105.

Iyer et al., "Early Results from 3DESS: A 3D Engineering Shape Search System," *International Symposium on Product Lifecycle Management*, Jul. 17, 2003, India, 10 pages (Program Schedule attached, 5 pages).

Iyer et al., "A Reconfigurable 3D Engineering Shape Search System. Part I: Shape Representation," *Proceedings of DETC '03*, Sep. 2-6, 2003, Chicago, IL, 10 pages.

Kazhdan et al., "Shape Matching and Anisotropy," *ACM Transactions on Graphics*, 2004, Los Angeles, CA, 7 pages.

Kazhdan et al., "A Reflective Symmetry Descriptor for 3D Models," *Algorithmica*, 2003, 38(2):201-225.

Kazhdan et al., "Rotation Invariant Spherical Harmonic Representation of 3D Shape Descriptors," *Eurographics Symposium on Geometry Processing*, 2003, 9 pages.

Kazhdan and Funkhouser, "Harmonic 3D Shape Matching," *SIGGRAPH 2002 Technical Sketches*, 2002, p. 191.

Kazhdan et al., "A Reflective Symmetry Descriptor," *European Conference on Computer Vision (ECCV)*, May 2002, 15 pages.

Lou et al., "A Reconfigurable 3D Engineering Shape Search System Part II: Database Indexing, Retrieval and Clustering," *Proceedings of ASME DETC '03*, Sep. 2-6, 2003, Chicago, IL, 10 pages.

Lou et al., "Content-based Three-Dimensional Engineering Shape Search," *Proceedings of the 20th International Conference on Data Engineering (ICDE04)*, Mar. 30-Apr. 2, 2004, Boston, USA, pp. 754-765.

Min, "A 3D Model Search Engine," Ph.D. Thesis, Princeton University, Jan. 2004, 126 pages.

Min et al., "Early Experiences with a 3D Model Search Engine," *Web3D Symposium*, Mar. 2003, Saint Malo, France, pp. 7-18.

Min et al., "A 2D Sketch Interface for a 3D Model Search Engine," *SIGGRAPH 2002 Technical Sketches*, 2002, p. 138.

Osada et al., "Shape Distributions," *ACM Transactions on Graphics*, 2002, 21(4):807-832.

Osada et al., "Matching 3D Models with Shape Distributions," *Shape Modeling International*, May 2001, Genova, Italy, 14 pages.

Qamhiyah and Flugrad, "CADSeek," Powerpoint presentation to Ames, Iowa Chamber of Congress, Nov. 18, 2003, 18 pages.

Qamhiyah and Flugrad, "CADSeek. Geometric-Based CAD File Search," Nov. 27, 2003, 4 pages.

Qamhiyah, "Classification of 3-Dimensional Object Model for Computer-Aided Design," Ph.D. Thesis, University of Toronto, 1993, 139 pages.

"Researchers develop 3-D search engine," http://www.cnn.com/2004/TECH/internet/04/16/3d.search.ap/index.html, printed from internet on May 11, 2004, 3 pages.

Shilane et al., "The Princeton Shape Benchmark," *Shape Modeling International*, Jun. 2004, Genova, Italy, 12 pages.

Sun and Qamhiyah, "Parametric face coding for invariant model representation," *Computer-Aided Design*, 2003, 35:519-532.

* cited by examiner

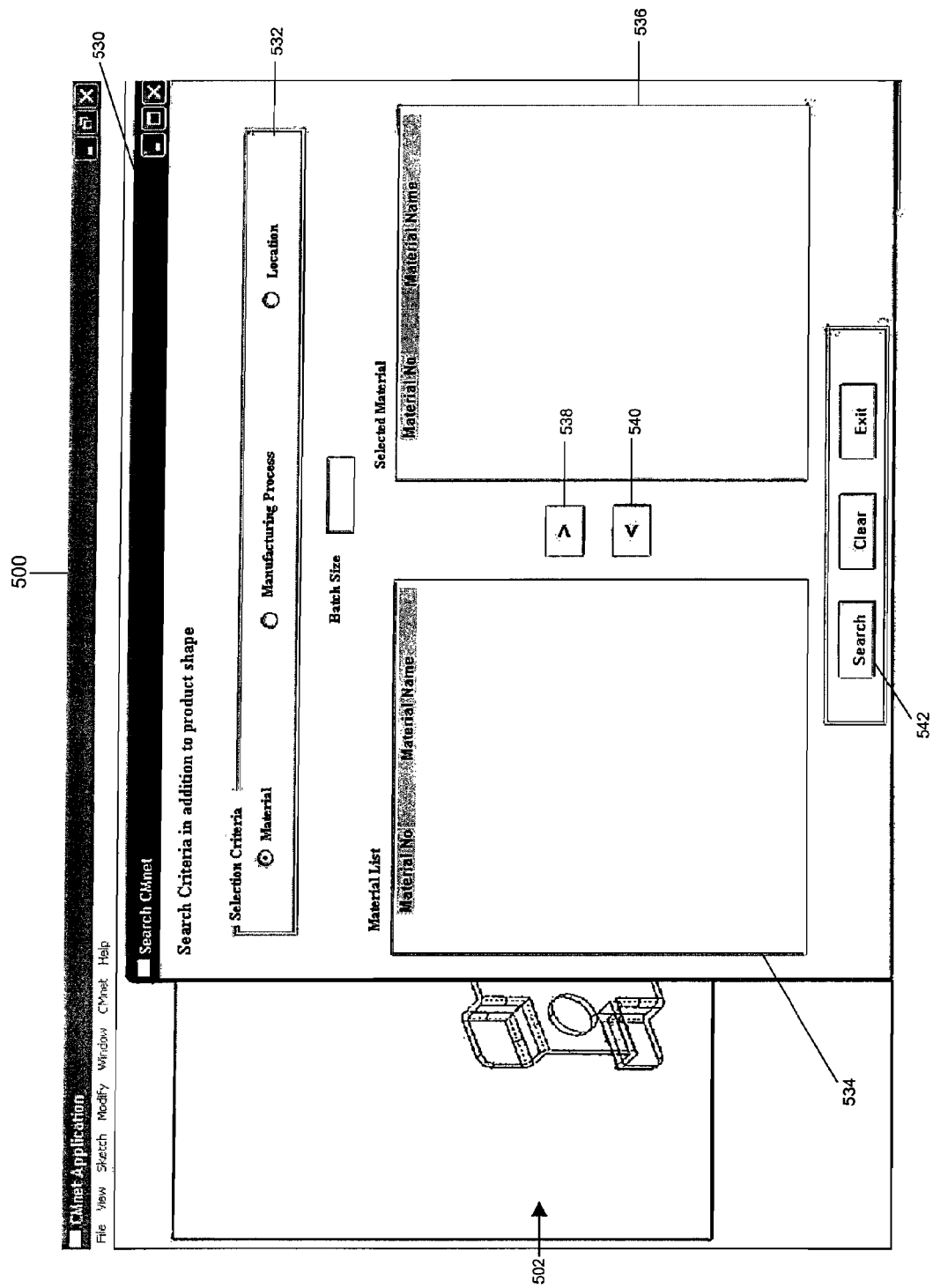

GEOMETRIC SEARCH ENGINE

CROSS-REFERENCE TO RELATED APPLICATION

This application is a divisional of U.S. application Ser. No. 10/883,001, filed Jun. 30, 2004, entitled Geometric Search Engine, which is hereby incorporated by reference.

STATEMENT REGARDING FEDERALLY SPONSORED RESEARCH

The work described herein was carried out, at least in part, using funds from National Science Foundation (NSF) Grant No. DMI-0329212. The government may, therefore, have certain rights in the invention.

TECHNICAL FIELD

This application relates to search engines for use in computing systems.

BACKGROUND

Computer aided design (CAD) technology assists designers in preparing new designs of components, drawings, specifications, part lists, and other design related elements. The technology is used for a wide variety of components in such fields as architecture, electronics, aerospace, and automotive engineering. CAD systems include three-dimensional modeling and computer-simulated operation of models. Rather than having to build prototypes and change components to determine the effects of tolerance ranges, engineers can use computers to simulate operation to determine loads and stresses. For example, an automobile manufacturer might use a CAD system to calculate the wind drag on several new car-body designs without having to build physical models of each design.

Searching existing CAD files is beneficial for a variety of reasons. An engineer may determine how a previous designer overcame design complexities by viewing a similar part. A previous design may be similar enough so that the designer can borrow certain elements and features from the existing design. The designer can incorporate the existing elements or features into the new design. A designer may also search existing CAD files for a similar part to extrapolate an estimate of component costs before investing time and money.

Locating previously designed CAD files can be tedious and cumbersome. A user may have to search in various storage areas such as, for example, disk drives and computer directories. A user searching for a CAD model usually has to rely upon a naming convention used by a previous user. Naming conventions for a CAD file may vary as the CAD model is subsequently modified. Additionally, since a CAD model typically does not have text associated with it, a textual search for a particular CAD file may be extremely difficult. For example, in order to search for a CAD file with a particular feature, the user may be required to know the particular name of the CAD file or the name of a particular feature modeled within the file.

In addition, the tools used by purchasing departments or matchmaking services that are limited to industry codes or text-based searches may present various issues. For example, industry codes are typically very broad and may fail to focus on specific component categories such as size, material type or tolerances. Text-based searches are often language dependent and may not allow the designer to properly convey design requirements to potential manufacturers.

SUMMARY

Various implementations are provided herein. One implementation provides a method to provide information associated with a previously designed component having a geometry that is similar to a geometry of a source component. In this implementation, the method includes obtaining a first set of coefficients for a non-invertible representation of the geometry of the source component, and comparing the first set of coefficients to a second set of coefficients for a non-invertible representation of the geometry of the previously designed component. If the first set of coefficients matches the second set of coefficients according to a threshold of similarity, the method further includes providing a search result associated with the previously designed component.

Certain implementations may provide various advantages. For example, when a search is performed, the geometry of the current design is compared with existing CAD files to find parts that have the most similar geometries. This type of search methodology based on geometric shape has a variety of applications. A company can use the geometric search methodology to search within its own CAD file library. Thus, a designer can quickly and easily locate a similar part previously created within the company. In addition, the geometric search methodology can be used across a company's supply chain to qualify contract manufacturing candidates.

For example, contract manufacturers (CM's) may load CAD files that have been previously created into a web-based library. Original equipment manufacturers (OEM's) are then able to search this library for similar parts already produced by the CM's. The more similarities that exist between parts previously or currently manufactured by a CM and the part an OEM desires to have manufactured, the more qualified the CM is to produce that part for the OEM. When a CM and OEM are compatible, a matchmaking process is considered successful. Tolerance and material type can be included within the search operation to provide additional qualification metrics.

In one implementation, a manufacturing module automates the coding of a component's geometry based upon its CAD model. The geometry includes the shape and/or the size dimensions of the component. To automate the coding of the component's geometry, a code is created for a "virtual potential" that surrounds the component if a uniform electrostatic charge were distributed on all the component's surfaces. The "virtual potential" is obtained through a solution of Poisson's equation. The simulated electrostatic charge distribution of the surfaces of the component are the boundary conditions used for the solution to Poisson's equation. The solution of Poisson's equation for a given set of boundary conditions is unique in that the boundary conditions are representative of the component's geometry. The solution of Poisson's equation as applied to the component's geometry creates a unique, searchable code that cannot be reversed back into CAD file data.

The manufacturing module systematically clusters similar component codes into families and generates an "exemplary geometry" for a family of components. An exemplary geometry is an overall code representing all the components assigned to a family. The manufacturing module searches and evaluates the similarity of a new component's code to the exemplary geometries of families of components. The exemplary geometry facilitates the match between a newly modeled component and the existing families of components.

DESCRIPTION OF DRAWINGS

FIG. 5A through FIG. 5D are screen diagrams of windows in a graphical user interface (GUI) that allow a user to transform CAD files into coded files and to search for similar coded files, according to one implementation.

DETAILED DESCRIPTION

Figure 1:
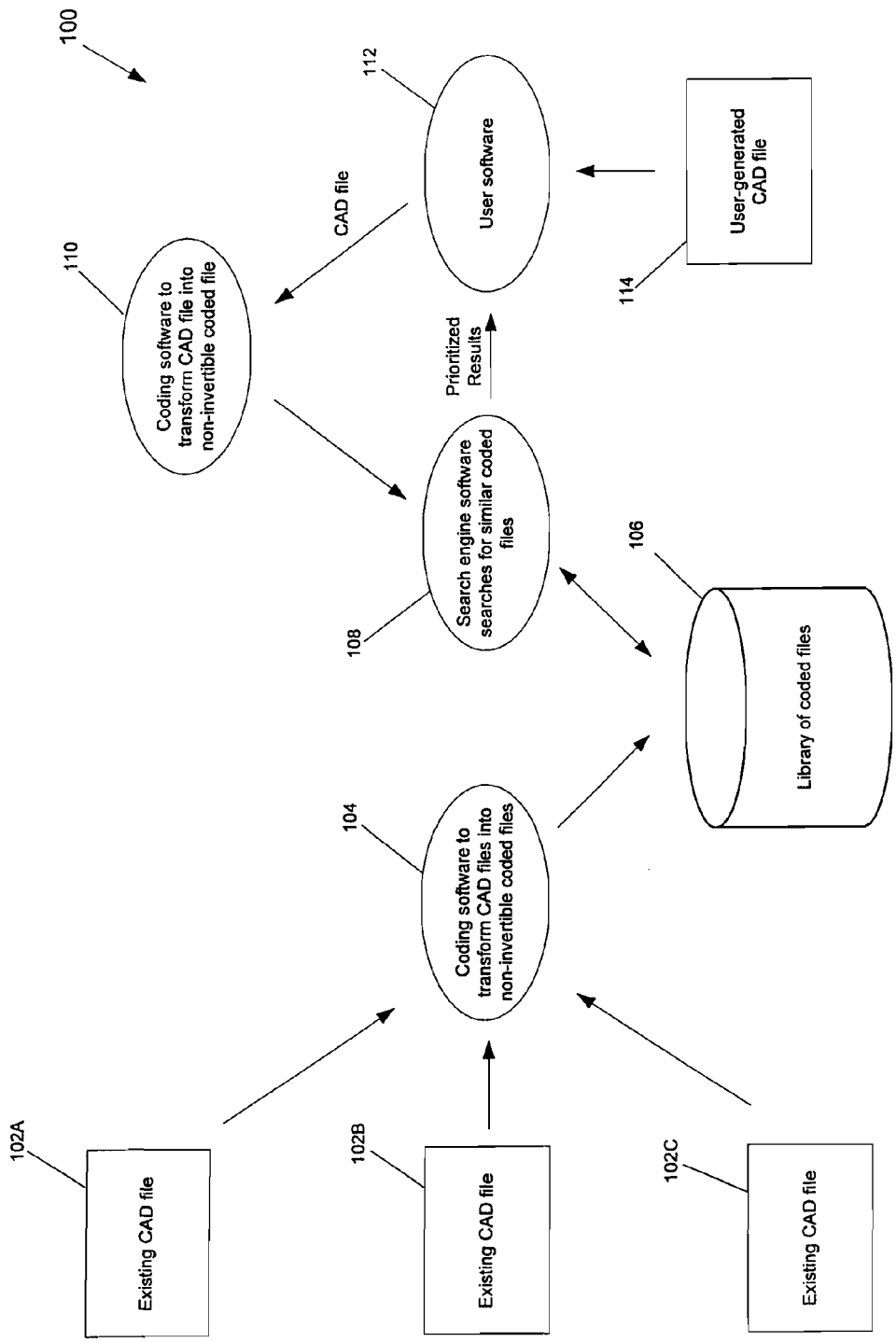
FIG. 1 is a diagram of procedure to transform computer-aided design (CAD) files into coded files that are searchable by a search engine, according to one implementation.

FIG. 1 is a diagram of procedure 100 to transform computer-aided design (CAD) files into coded files that are searchable by a search engine, according to one implementation. This implementation provides a geometric coding and search methodology to simplify searches based on a code derived from an overall shape and design of a component of a CAD file, such as a user-generated CAD file 114. Using the procedure 100, software modules are capable of searching for previously designed components having geometries that are similar to a geometry of a source component represented in the user-generated CAD file 114. Coded representations of these previously designed components are stored in a library 106 and are grouped into families of related representations. In one implementation, an exemplary geometry associated with each family is represented in a coded form and used during search operations.

As shown in FIG. 1, the user-generated CAD file 114 is fed as input into user software 112. The CAD file 114 is a computer file that is generated from a CAD design tool. The CAD file 114 contains a modeled representation of a user-generated design component, such as a computer keyboard, a tool, an automotive component, a disk drive assembly, or the like. A user is able to create this model using the CAD design tool. Often, when the user wants to search for similar components, the user is able to quickly create a rough design of the component in a short amount of time. This rough design may include various aspects and/or limitations that are important for the search operation. In one implementation, the user creates a three-dimensional design of the component using the CAD tool.

The user software 112 processes the CAD file 114 and provides it to coding software 110. In one implementation, the user software 112 includes CAD design-tool software for creating and processing the CAD file 114. The coding software 110 analyzes the representation of the geometry of the component contained within the CAD file 114 and transforms the CAD file 114 into a coded file. In this detailed description, coded files are named as such because they each include a coded representation of the geometry of a component, as will be described in further detail below. In one implementation, the geometry of the component includes both a shape and size of the component. The coded file contains a non-invertible representation of the component. That is, the non-invertible representation cannot be transformed back into the original representation of the geometry of the component as modeled within the CAD file 114. This provides a level of security of the representation contained within the coded file. If the user wishes to maintain secrecy of the original, viewable design of the component, the coding software 110 provides a coded, non-invertible representation of this design. In one implementation, the coded representation is at least partially independent of a translation and/or a rotation of the component in three-dimensional space. In this implementation, the coded representation can be matched with similar representations that are associated with components that are similar to the component modeled in the CAD file 114 but that have been translated or rotated in three-dimensional space.

The coding software 110 provides the coded file to search engine software 108. The search engine software 108 uses the coded file as input and searches for similar coded files in the library 106. The search engine software 108 uses a search algorithm that is described in more detail below. The coded files contained within the library 106 include coded representations of geometries of previously designed components. These files have been previously generated and stored within the library 106. The coded representations have a format that is common to the representation contained within the coded file provided by the coding software 110. For example, in one implementation, each coded representation of a geometry of a component includes a set of coefficients for a series that is a solution to a differential equation as applied to the geometry of the component as boundary conditions, as will be described below in more detail.

In one implementation, related coded files within the library 106 are grouped, or clustered, together. In this implementation, the library 106 includes separate coded files that are each associated with one group of related coded files within the library 106. Each of these separately coded files provides an exemplary representation of a geometry for a component that is representative of all of the related coded files within a given group. The related coded files are associated with previously designed components having similar geometries or other similar properties, such as a manufacturing location or a manufacturing material. The search engine software 108 searches for similar coded files within the library 106 by comparing the input coded file provided by the coding software 110 to the various coded files in the library 106 that contain these exemplary representations. If a match is found, the search engine software 108 can further compare the input coded file to the coded files contained within a matching group of related files to identify a closest match.

If the search engine software 108 obtains a set of search results associated with matching coded files located in the library 106, the search engine software 108 prioritizes these search results and provides them to the user software 112. The search engine software 108 may prioritize these results according to the level of similarity between the input coded file received from the coding software 110 and the coded files identified within the library 106. When the user software 112 receives these results, it is capable of displaying them to a user within a graphical user interface (GUI). In one implementation, the search results include information associated with the manufacturers of the components for the matching coded files identified within the library 106. For example, if a manufacturer "A" and a manufacturer "B" both manufacture similar components whose coded files have been identified in the library 106 by the search engine software 108, contact information for manufacturer "A" and manufacturer "B" may be displayed by the user software 112 within the GUI. This contact information may include the email address, street address, telephone number, and/or fax number for manufacturer "A" and manufacturer "B". Examples of various GUI's that may be provided by the user software 112 are shown in FIG. 5A through FIG. 5D and described in further detail below.

In one implementation, the library 106 is a repository such as a database system. As noted above, the coded files stored within the library 106 have been previously generated. Coding software 104 generates the coded files that are stored in the library 106. In one implementation, the coding software 104 is capable of grouping, or clustering, similar coded files and generating a coded file containing an exemplary representation of a geometry for the components represented by the other coded files within the group. The coding software 104 transforms existing CAD files, such as the CAD files 102A, 102B, and 102C into non-invertible coded files and provides these files to the library 106. In one implementation, the coding software 104 uses the same coding algorithm as the coding software 110. One such coding algorithm is explained in further detail below. The coding software 104 is able to generate a second representation of a geometry of a component from a first representation of the geometry of the component as modeled in one of the CAD files 102A, 102B, or 102C.

The CAD files 102A, 102B, and 102C are each computer files that include representations of geometries of previously designed components. For example, manufacturing designers may create CAD models of these previously designed components and store these models in the CAD files 102A, 102B, and 102C. These designers may work for manufacturers who may wish to provide coded representations of these CAD models to the library 106 so that they are available by the search engine software 108 during search operations. In this way, a user such as a designer or an original equipment manufacturer (OEM) may be able to use the user software 112 and search for components provided by the manufacturers who have created the CAD files 102A, 102B, and 102C. A designer for the OEM may need to spend only a small amount of time creating the CAD file 114 early in the design process and to identify manufacturers of similar components by obtaining search result information provided by the search engine software 108. Further, matching OEM's and manufacturers may reduce part cost through efficient operations, capable equipment and superior manufacturing knowledge.

Figure 2:
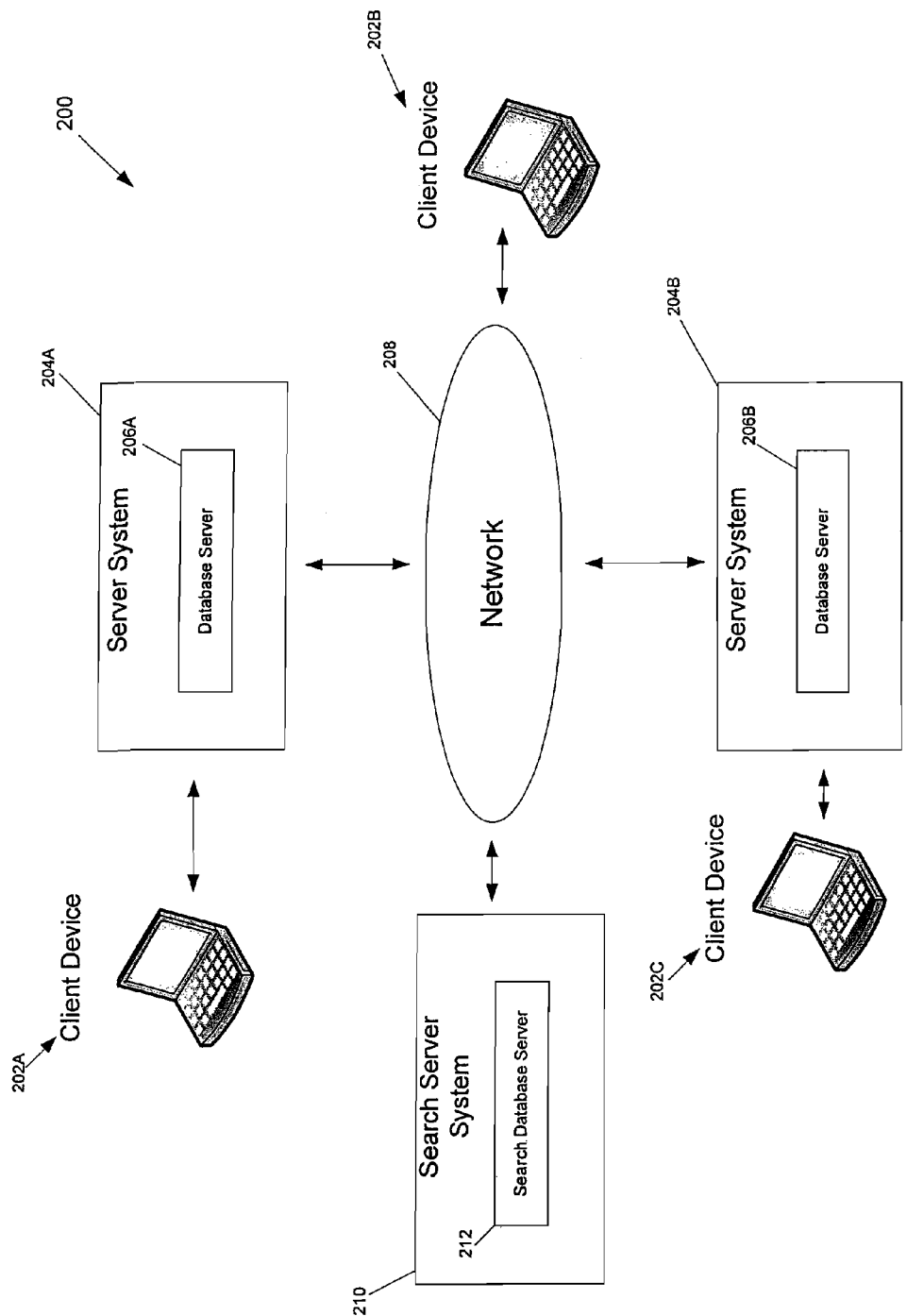
FIG. 2 is a block diagram of a system that may be used to implement the procedure shown in FIG. 1.

FIG. 2 is a block diagram of a system 200 that may be used to implement the procedure shown in FIG. 1. As shown in FIG. 2, the system 200 includes client devices 202A, 202B, and 202C, server systems 204A and 204B, a search server system 210, and a network 208. The client devices 202A and 202C are coupled to the server systems 204A and 204B, respectively. The server systems 204A and 204B, the client device 202B, and the search server system 210 are each coupled to the network 208, which may comprise an Internet network providing web-enabled connectivity. The server systems 204A and 204B contain database servers 206A and 206B, respectively. These database servers 206A and 206B are capable of storing coded files. The search server system 210 includes a search database server 212. In one implementation, the search database server 212 is also capable of storing coded files. In one implementation, the search database server 212 also includes an indexing mechanism to identify server systems 204A and 204B along with the client device 202B as repositories for specified coded files. Each of the client devices 202A, 202B, and 202C are capable of storing both original CAD files and generated coded files, according to one implementation.

In one implementation, manufacturers may use the client devices 202A and 202C to create the CAD files 102A, 102B, and/or 102C. As shown in the example of FIG. 2, the client devices 202A and 202C are laptop computers, but various other forms of computing devices may be used instead. The client devices 202A and 202C are loaded with CAD tool software so that the manufacturers may create the models of previously designed components and save these models in the CAD files 102A, 102B, and/or 102C.

In one implementation, the coding software 104 resides on the client devices 202A and 202C. In another implementation, the coding software 104 resides on the server systems 204A and 204B. After the coding software 104 generates the non-invertible coded files, these files are stored within the database servers 206A and 206B. The library 106 includes coded files stored in either of the database servers 206A or 206B.

In one implementation, the server systems 204A and 204B communicate with the search server system 210 over the network 208. The search database server 212 includes an index of the coded information that is stored within the database servers 206A and 206B. The index is compiled and managed by the search server system 210.

In one implementation, the server systems 204A and 204B provide all of the coded files contained within the database servers 206A and 206B, respectively, to the search server system 210 for storage. The search server system 210 stores these files within the search database server 212. In this implementation, the master library 106 of coded files is managed by the search database server 212.

If a designer wishes to search for related components, the designer may use the client device 202B to create the CAD file 114. The user software 112 and the coding software 110 is resident on the client device 202B in one implementation.

In one implementation, the search engine software 108 resides on the search server system 210. In one implementation, the search engine software 108 resides on the client device 202B. The client device 202B communicates with the search server system 210 over the network 208. In one implementation, the search engine software 108 searches the search database server 212 of the search server system 210 for related coded files. If the search database server 212 contains an index of coded files contained within the database servers 206A and 206B, the search engine software 108 uses this index to determine if either the database server 206A and 206B may contain coded files that are similar to the coded file generated by the client device 202B. In one implementation, the client device 202B is capable of directly searching for related coded files contained within the database servers 206A and 206B.

Figure 3A:
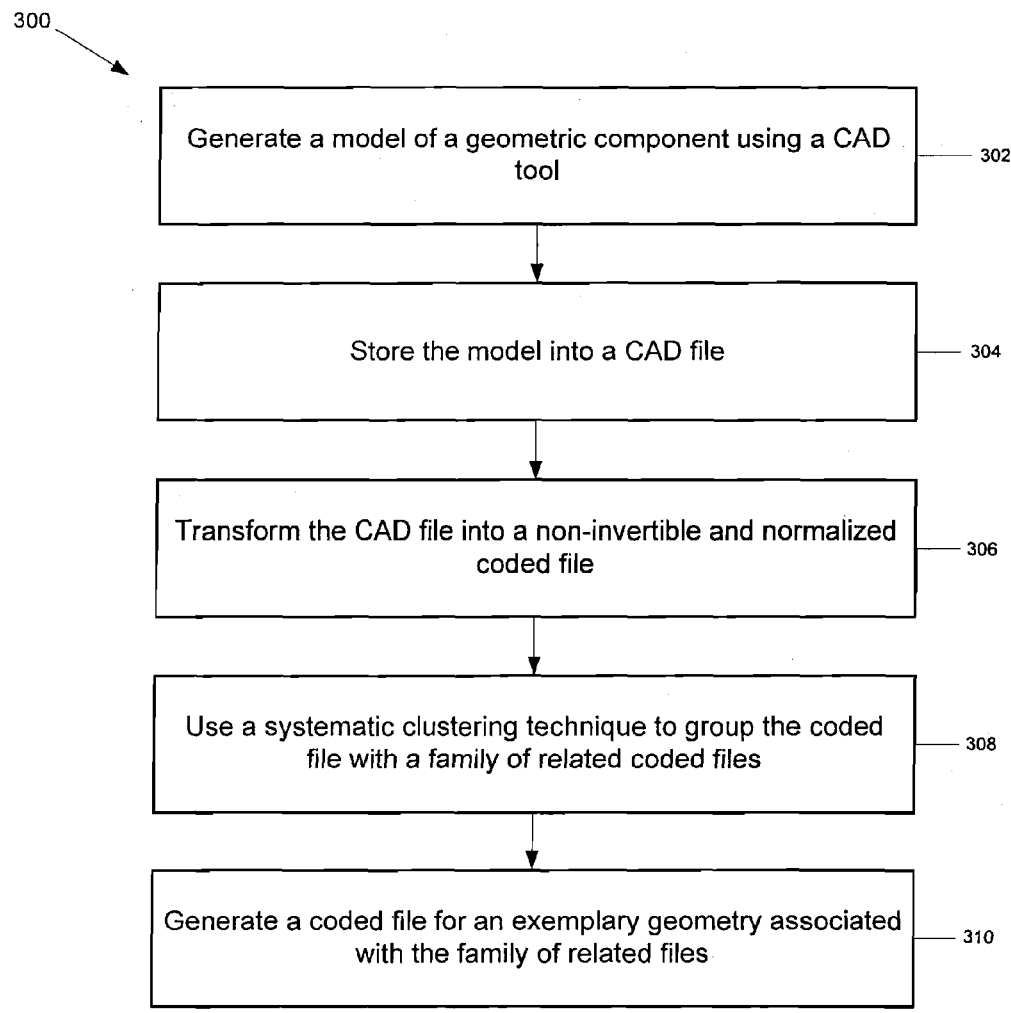
FIG. 3A is a flow diagram of a method to transform a CAD file into a coded file, according to one implementation.

FIG. 3A is a flow diagram of a method 300 to transform a CAD file into a coded file, according to one implementation. In this implementation, the method 300 includes actions 302, 304, 306, 308, and 310. In the action 302, a model of a geometric component is generated by a CAD tool program. A designer, such as a designer working for a manufacturer, may use the client device 202A or 202C to interact with the CAD tool program. In the action 304, the model is stored into the CAD file 102A, 102B, or 102C shown in FIG. 1. In an action 306, the coding software 104 transforms the CAD file 102A, 102B, or 102C into a non-invertible and normalized coded file. This normalized coded file includes a representation of the geometry of the component that is independent, or at least partially independent, of a translation or a rotation of the component in three-dimensional space.

In the action 306, a code is created for a "virtual potential" that surrounds the component as if a uniform electrostatic charge were distributed on all of the surfaces of the component. The simulated electrostatic charge distribution on the surfaces of the component is the boundary condition for a solution to a differential equation (Poisson's equation).

To code a component's shape and dimensions based on its model, such as a computer-aided design (CAD) model, a description of the component's shape from its Boundary Model Representation (B-Rep) as included in a CAD model can be mathematically converted into a boundary value problem. The solution function of the boundary value problem may be expressed in series form, where the coefficients of the series expansion are unique representatives of the boundary conditions. Since a component's surfaces are the boundary conditions used for the solution, the series coefficients are a unique code of the component's shape.

An electrostatic field distribution has the following properties: (1) the field satisfies Poisson's equation for which the solution is unique for a given boundary conditions set; (2) boundary conditions are defined by sampling the component's surfaces; (3) the field satisfies the principle of superposition and as a result, a complicated component's geometry could be partitioned and the overall solution would be the superposition of the sub-solutions; and (4) the solution is non-invertible, such that a given field solution cannot be reversed to obtain the component of the boundary generating it.

In a parallelepiped boundary containing an arrangement of static charge distribution $\rho(x, y, z)$ defined over the surface of a component with an arbitrary shape, the field (characterized by the scalar potential $\phi$) induced by the distributed charge will satisfy Poisson's equation:

$$\frac{\partial^2 \phi}{\partial x^2} + \frac{\partial^2 \phi}{\partial y^2} + \frac{\partial^2 \phi}{\partial z^2} = \frac{-\rho(x, y, z)}{\varepsilon}$$

where $\varepsilon$ is the permittivity of the material surrounding the distributed charge, and x, y, z, are spatial position coordinates.

A function is first found which satisfies the boundary conditions of the problem, and the constants of the function are then chosen to satisfy Poisson's equation. Such a function has the following form:

$$\phi = \sum_m \sum_n \sum_k B_{mnk} \sin(mx)\sin(ny)\sin(kz).$$

The boundary is replaced by an infinite set of images of the initial field and so the desired function defining the resultant field inside the boundary must be periodic with these coordinates x, y, and z. Its general form is given, therefore, by the components of a triple single Fourier series, one in x, one in y, and one in z.

$$\phi = \sum_m \sum_n \sum_k B_1 \cos(mx)\cos(ny)\cos(kz) + \\ \sum_m \sum_n \sum_k B_2 \cos(mx)\sin(ny)\cos(kz) + \\ \sum_m \sum_n \sum_k B_3 \cos(mx)\sin(ny)\sin(kz) + \\ \sum_m \sum_n \sum_k B_4 \cos(mx)\cos(ny)\sin(kz) + \\ \sum_m \sum_n \sum_k B_5 \sin(mx)\cos(ny)\cos(kz) + \\ \sum_m \sum_n \sum_k B_6 \sin(mx)\sin(ny)\cos(kz) + \\ \sum_m \sum_n \sum_k B_7 \sin(mx)\sin(ny)\sin(kz) + \\ \sum_m \sum_n \sum_k B_8 \sin(mx)\cos(ny)\sin(kz)$$

Boundaries are chosen such that $(\phi|_{x=0}=0)$ $(\phi|_{y=0}=0)$ $(\phi|_{z=0}=0)$ $(\phi|_{x=2R}=0)$ $(\phi|_{y=2R}=0)$ $(\phi|_{z=2R}=0)$ where R is the radius of a spherical region surrounding the component beyond which the filed is uniformly equal to zero (due to the inverse proportionality between the field intensity at a point and the distance of the point from the static charge distribution).

Substitution of the boundary conditions at x=y=z=0 into the series equation results in having $B_1=B_2=B_3=B_4=B_5=B_6=B_7=B_8=0$, and the series equation is reduced to $$\phi = \sum_m \sum_n \sum_k B_{mnk} \sin(mx)\sin(ny)\sin(kz).$$

Substitution of the boundary condition at x=2R results in $$0 = \sum_m \sum_n \sum_k B_{mnk} \sin(2Rm)\sin(ny)\sin(kz)$$

for any y and z. This equation is satisfied when 2Rm is an even multiple of $\pi/2$. Given an h which is an integer taking values from 1 to $\infty$, this condition is represented mathematically in the form:

$$m_h = \frac{\pi(h-1)}{2R}$$

Similarly, for y=2R and Z=2R $$n_l = \frac{\pi(l-1)}{2R}$$

and $$k_p = \frac{\pi(p-1)}{2R}.$$

Substitution of the coefficients $m_h$, $n_l$, $k_p$ into the series equation form results in $$\phi = \sum_h \sum_l \sum_p B_{hlp} \sin\frac{\pi(h-1)x}{2R} \sin\frac{\pi(l-1)y}{2R} \sin\frac{\pi(p-1)z}{2R}.$$

For this equation to be the required field solution, it also satisfy Poisson's equation over the region containing the part, and Laplace's equation elsewhere in the region external to the part. Poisson's equation is satisfied when $$\frac{\partial^2 \phi}{\partial x^2} + \frac{\partial^2 \phi}{\partial y^2} + \frac{\partial^2 \phi}{\partial z^2} = \frac{-\rho(x, y, z)}{\varepsilon}$$

where $\rho(x, y, z)$ is equal to the charge distribution over a component's boundary, and is equal to zero everywhere else, and $\varepsilon$ is the permittivity of the material.

The left hand side of the equation is evaluated by calculating the partial derivatives of the series. As a result, Poisson's equation has the form:

$$\sum\sum\sum (m^2h+n^2l+k^2p)B_{hlp}\sin(m_hx)\sin(n_ly)\sin(k_pz) = \frac{\rho(x,y,z)}{\varepsilon}.$$

The value of $B_{hlp}$ is determined by multiplying both sides of the equation by $\sin(m_hx)\sin(n_ly)\sin(k_pz)$ and by integrating over the volume of the field space (one period).

$$\int\int\int (m^2h+n^2l+k^2p)B_{hlp}(\sin(m_hx)\sin(n_ly)\sin(k_pz))^2 dx.dy.dz =$$
$$\int\int\int \left(\frac{\rho(x,y,z)}{\varepsilon}\right)\sin(m_hx)\sin(n_ly)\sin(k_pz)dx.dy.dz$$

Integration of the left hand side of this equation results in $$(m^2h+n^2l+k^2p)\left(2\frac{R}{2}-\frac{(\sin 4Rm_h)}{4Rm_h}\right)$$
$$\left(2\frac{R}{2}-\frac{(\sin 4Rn_l)}{4Rn_l}\right)\left(2\frac{R}{2}-\frac{(\sin 4Rk_p)}{4Rk_p}\right)B_{hlp}.$$

But $$2Rm_h = \frac{2(h-1)\pi}{2}.$$

Therefore, $\sin(4Rm_h)=0$. Similarly $\sin(4Rn_l)=\sin(4Rk_p)=0$. As a result, $$(m^2h+n^2l+k^2p)\left(2\frac{R}{2}-\frac{(\sin 4Rm_h)}{4Rm_h}\right)\left(2\frac{R}{2}-\frac{(\sin 4Rn_l)}{4Rn_l}\right)$$
$$\left(2\frac{R}{2}-\frac{(\sin 4Rk_p)}{4Rk_p}\right)B_{hlp} = (m^2h+n^2l+k^2p)R^3 B_{hlp}$$

Therefore, the expression for $B_{hlp}$ becomes $$\frac{1}{\left(\left(\left(\frac{\pi(h-1)}{2R}\right)^2+\left(\frac{\pi(l-1)}{2R}\right)^2+\left(\frac{\pi(p-1)}{2R}\right)^2\right)R^3\right)}$$
$$\int\int\int \frac{\rho(x,y,z)}{\varepsilon}\sin\left(\frac{\pi(h-1)x}{2R}\right)\sin\left(\frac{\pi(l-1)y}{2R}\right)\sin\left(\frac{\pi(p-1)z}{2R}\right)dx.dy.dz$$

Within the context of a component's CAD model, $B_{hlp}$ are the coefficients of the series expansion of the field surrounding the component shape in space. R is the radius of a spherical region surrounding the component beyond which the field essentially vanishes due to the inverse proportionality between the field intensity at a point and the distance of the point from the static charge distribution.

Since the series is a solution of Poisson's equation with an electrostatic charge applied to the surfaces of a component as boundary conditions, and since the solution of Poisson's equation is unique for a given set of boundary conditions, it follows that the coefficients, $B_{hlp}$ are a unique code of a component's geometry. In addition, since the solution of an electrostatic field distribution is mathematically non-invertible, the coefficients $B_{hlp}$ cannot be used to retrieve the component's geometry as represented in the original CAD model before coding.

In order to identify these coefficients for a given object, or component, in three-dimensional space, the following algorithm is used in one implementation.

(1) Read the object data using sampled surface points.
(2) Shift to the centroid of the object's center of mass.
(3) Find the inertia matrix.
(4) Find principal axes (eigenvectors) by Rayleigh method. After choosing an arbitrary initial vector, the Rayleigh method gives a reasonably accurate eigenvector of the inertia matrix, corresponding to the largest eigenvalue. In one implementation, one thousand iterations are used. Other algorithms may also be used, such as the "inverse Rayleigh method," the numerical or Cardan solution of the characteristic equation for the eigenvalues followed by calculation of the eigenvectors.
(5) Invert the inertia matrix to determine the eigenvector of the least eigenvalue. Rayleigh's method is applied to the inverse of the inertia matrix to find an eigenvector of the smallest eigenvalue of the inertia matrix.
(6) Vector cross product the principal axes by the minimum eigenvector to find intermediate principal axis.
(7) Find sampled object coordinates in principal-axis frame. The coordinate system is already center-of-mass so the coordinates in the orthonormal principal-axis (i.e., eigenvector) frame, are found by taking dot products. There is an ambiguity in the sign of the new coordinates due to the inability to define a positive direction of the principal axes. This ambiguity will cause most of the Fourier coefficients to be unusable, but there exist many Fourier coefficients that do not depend on the choice of axis direction.
(8) Define "canonical" cube, for Fourier series expansion. The Fourier series expansion of the gravitational potential of the object must be calculated in defined space. This space is defined as a cube parallel to the principal axes. The sum of squared coordinate deviations, gives the sum of squared distances of the points from the origin; it is a rotationally invariant. The edge of the cube is chosen equal to 4/sqrt(3) times the root-mean-square distance from the origin. That is 4 times the square root of the mean of the three mean square coordinate deviations. The cube extends two standard deviations out from the center. This standard deviation is the standard deviation of the coordinates of the points, not the standard deviation of the field. This size of cube was chosen because it would be just large enough to include all or almost all of the object, hence almost all of the varied and interesting part of the field. After the edge of the canonical cube has been calculated, the corners can be found.
(9) Find potential at grid points within cube. The Newtonian gravitational potential (or equivalently, Coulomb electric potential assuming all points have the same sign of charge) is calculated assuming equal mass for each point of the object. The realistic, 1/R, potential is used. Some experimentation was done with other potentials, such as 1/R^2 (which would save computation time due to the abolition of the slow square root function) but 1/R gave the best results. To avoid infinitely large potentials where a grid point happens to be very close to one of the necessarily finite number of points describing the object, an arbitrary minimum distance is inserted, using the "max" function in the denominator. Some experimentation with this minimum was done and the best value of 0.00000001 was chosen in one implementation.

(10) Find Fourier coefficients. A corner of the cube is taken as the origin. Therefore, the directional ambiguity of the principal axis becomes irrelevant, if all trigonometric functions, of any of the three coordinate variables, consist either of an odd number of sine half-waves, or of an even number of cosine half-waves. This restriction reduces the number of trigonometric terms by a factor of 2 for each coordinate, hence a factor of 2^3=8 overall. In this fashion, rotational dependency of the object in three-dimensional space is removed. Also, experiment confirms that due to the centration of the objects, the potential fields have very large lowest-order coefficients which drown out the discriminatory effects of the higher-order coefficients. The lowest-order coefficients are therefore eliminated from the comparative analysis. The coefficient for h=1=p=0 represents an average of the field. Eliminating this coefficient removes dependency on translation of the object in three-dimensional space.

(11) Select 1000 of the remaining coefficients. Experimentation determined that selection of 1000 of the remaining coefficients produced a sufficiently accurate representation of the geometry of the object. Experimental results are shown below for selections of 64, 216, 1000, and 4096 coefficients when comparing various different objects having known relationships and similarities/dissimilarities. Upon analysis of these results, it was determined that selection of 1000 coefficients yielded suitable results. Selection of a greater number of coefficients, such as 4096, may provide only slightly more accurate results but requires more computation time and storage space.

The experimental results shown below have the following format:

Correlation standard deviation [range] {no. of object pairs examined} (relation)

Using 64 Fourier Coefficients when Comparing Objects with Known Relationships:

+0.830(0.087)[0.641–0.942]{72}(unrelated object)

+0.901(0.059)[0.821–0.944]{12}(morphed objects)

+0.9999993(0.0000017)[0.999995–1]{7}(identical but rotated)

Using 216 Coefficients when Comparing Objects with Known Relationships:

+0.762(0.113)[0.445–0.906]{72}(unrelated objects)

+0.882(0.058)[0.805–0.932]{12}(morphed objects)

+0.999998(0.0000045)[0.999988–1]{7}(identical but rotated)

Using 1000 Coefficients when Comparing Objects with Known Relationships:

+0.727(0.113)[0.403–0.883]{72}(unrelated objects)

+0.857(0.051)[0.752–0.909]{12}(morphed objects)

+0.999989(0.000029)[0.999924–1]{7}(identical but rotated)

Using 4096 Coefficients when Comparing Objects with Known Relationships

+0.720(0.110)[0.407–0.877]{72}(unrelated objects)

+0.855(0.048)[0.793–0.903]{12}(morphed objects)

+0.999961(0.000103)[0.9997–1]{7}(identical but rotated)

These experimental results show that the selection and use of 1000 coefficients yields sufficiently accurate results in the representation of the geometry of an object. When 72 unrelated objects were compared, each object being represented by the use of 1000 coefficients, a range of similarity from a rating of 0.403 to 0.883 was found, wherein a rating of 0.0 indicates complete dissimilarity and a rating of 1.0 indicates complete similarity. This range does not substantially differ from a similar range tested when using 4096 coefficients. When 12 morphed objects were compared, each object being represented by the use of 1000 coefficients, a range of similarity from a rating of 0.752 to 0.909 was found. When 7 identical but rotated objects where compared, a range of similarity from a rating of 0.999924 to 1.0 was found. These ranges do not substantially differ from similar ranges tested when using 4096 coefficients. However, the use of 1000 coefficients does yield more accurate results than the use of only 64 or 216 coefficients. Therefore, 1000 coefficients are selected. These remaining coefficients are the normalized set of coefficients that correspond to the geometry of the object.

Referring again to FIG. 3A, in the action 308, the coding software 104 or the library 106 uses a systematic clustering technique to group the coded file with a family of related coded files that exist within the library 106. The coded file includes a representation of the geometry of the component and the related coded files include preexisting representations of geometries of similar components. The grouping operation occurs when a threshold of similarity is satisfied between the coded representation and the preexisting representations. This threshold is configurable and may be specified or predefined by an administrator. For example, in one implementation, a rating system is defined in which a rating of 0.0 indicates complete dissimilarity between representations of two components and a rating of 1.0 indicates complete similarity. A threshold of similarity may be configured for a rating of 0.9. If the representations of two separate components have a rating of 0.9 or higher, these two representations are grouped together.

In one implementation, the coded file may also be grouped with other preexisting coded files according to a manufacturing location, a component material, or a manufacturing process. For example, coded files that are associated with components that are manufactured in Georgia may be grouped into one cluster. In another example, coded files that are associated with components made of plastic or manufactured by a specific casting or injection molding process may be grouped into other clusters.

Finally, in an action 310, the coding software 104 generates a coded file for a representative or exemplary geometry associated with the family of related files. This coded file includes a representation of the exemplary geometry that is based upon the coded representation and the preexisting representations. In one implementation, the coded file generated in the action 310 has a minimum total dissimilarity with respect to and when compared with the coded representation and the preexisting representations.

The function of the representative geometry is to facilitate the match between a newly modeled component against families of components that have already been clustered. In a given family of components, the authors define a representative geometry as the component that has the minimum total dissimilarity with respect to the rest of the components in that family.

Figure 3B:
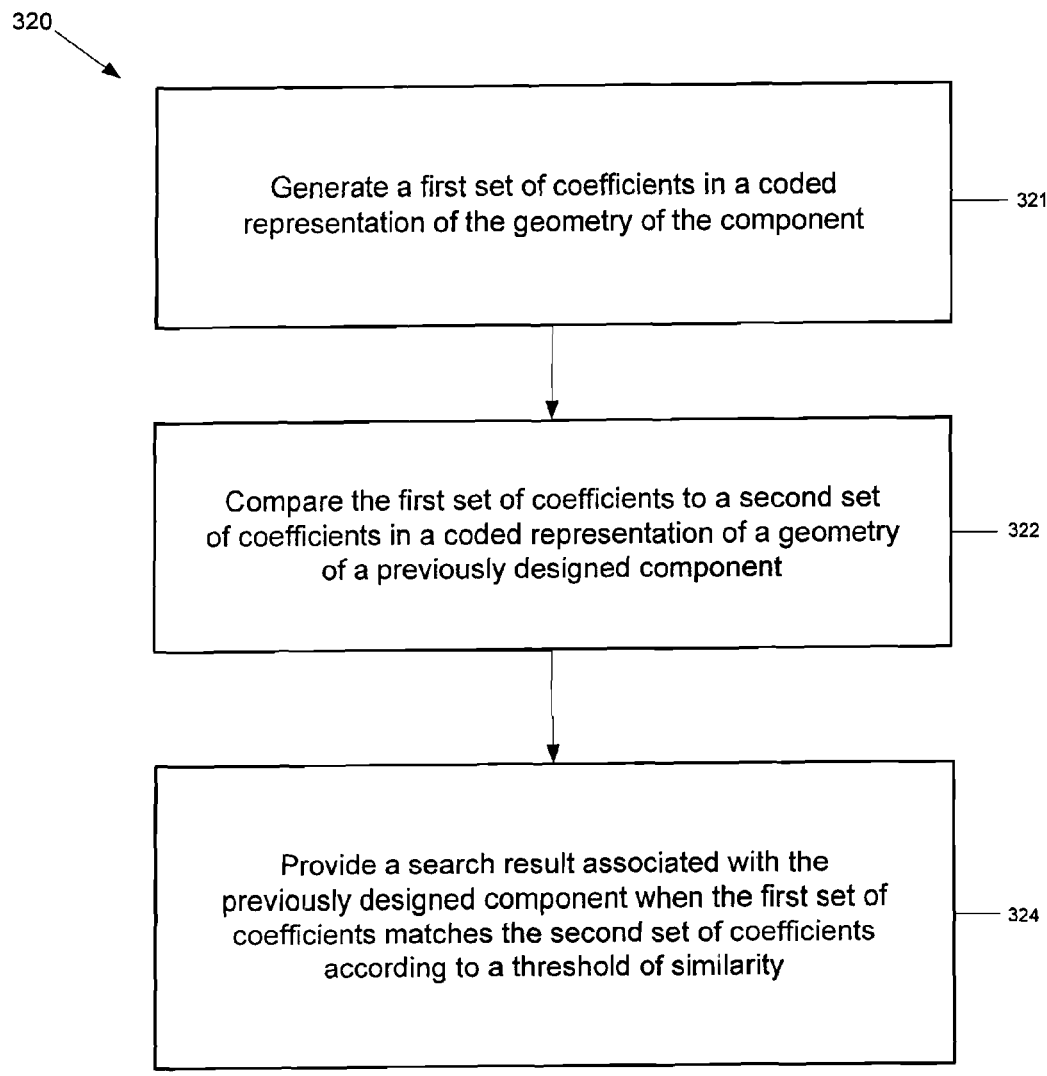
FIG. 3B is a detailed flow diagram of the method to match similar coded files, according to one implementation.

FIG. 3B is a detailed flow diagram of the method 320 to match similar coded files, according to one implementation. In this implementation, the method 320 includes actions 321, 322, and 324. In the action 321 shown in FIG. 3B, the coding software 110 generates a first set of coefficients for a series equation in a coded representation of the geometry of a component modeled in the user-generated CAD file 114. The coding software 110 generates the first set of coefficients in a manner similar to the way in which the coding software 104 generates coefficients as described above in reference to the action 306 FIG. 3A.

In the action 322, the search engine software 108 compares the normalized coefficients generated in the action 321 to coefficients in a coded representation contained in a file that is stored in the library 106 according to a threshold of similarity. This coded representation is one that represents a geometry of a previously designed component previously modeled and captured in the CAD file 102A, 102B, or 102C and then transformed using the method 300 shown in FIG. 3A. Because the coefficients are generated using a common method and have a common format, they can be compared for similarity. In one implementation, a rating system for the threshold of similarity is defined in which a rating of 0.0 indicates complete dissimilarity between representations of two components and a rating of 1.0 indicates complete similarity. The threshold of similarity may be configured for a rating of 0.9. The normalized set of coefficients is then compared to the set of coefficients for the coded representation. Each corresponding coefficient is compared (i.e., the first coefficient from each set, the second coefficient from each set, etc.) and an overall similarity rating, or calculation, is performed. If the calculation results in a rating of 0.9 or higher, these two sets of coefficients are deemed as a match. In one implementation, Euclidean distances are calculated for corresponding, ordered coefficients in each set to determine an overall similarity.

In the action 324, the search engine software 108 provides a search result associated with the previously designed component when the coefficients generated in the action 321 match the coefficients in the coded representation according to a threshold of similarity. This threshold determines if these coefficients sufficiently match to indicate a similarity between the component modeled in the CAD file 114 and the previously designed component modeled in one of the CAD files 102A, 102B, or 102C. In one implementation, the search result includes contact information for the manufacturer of the previously designed component.

Figure 4:
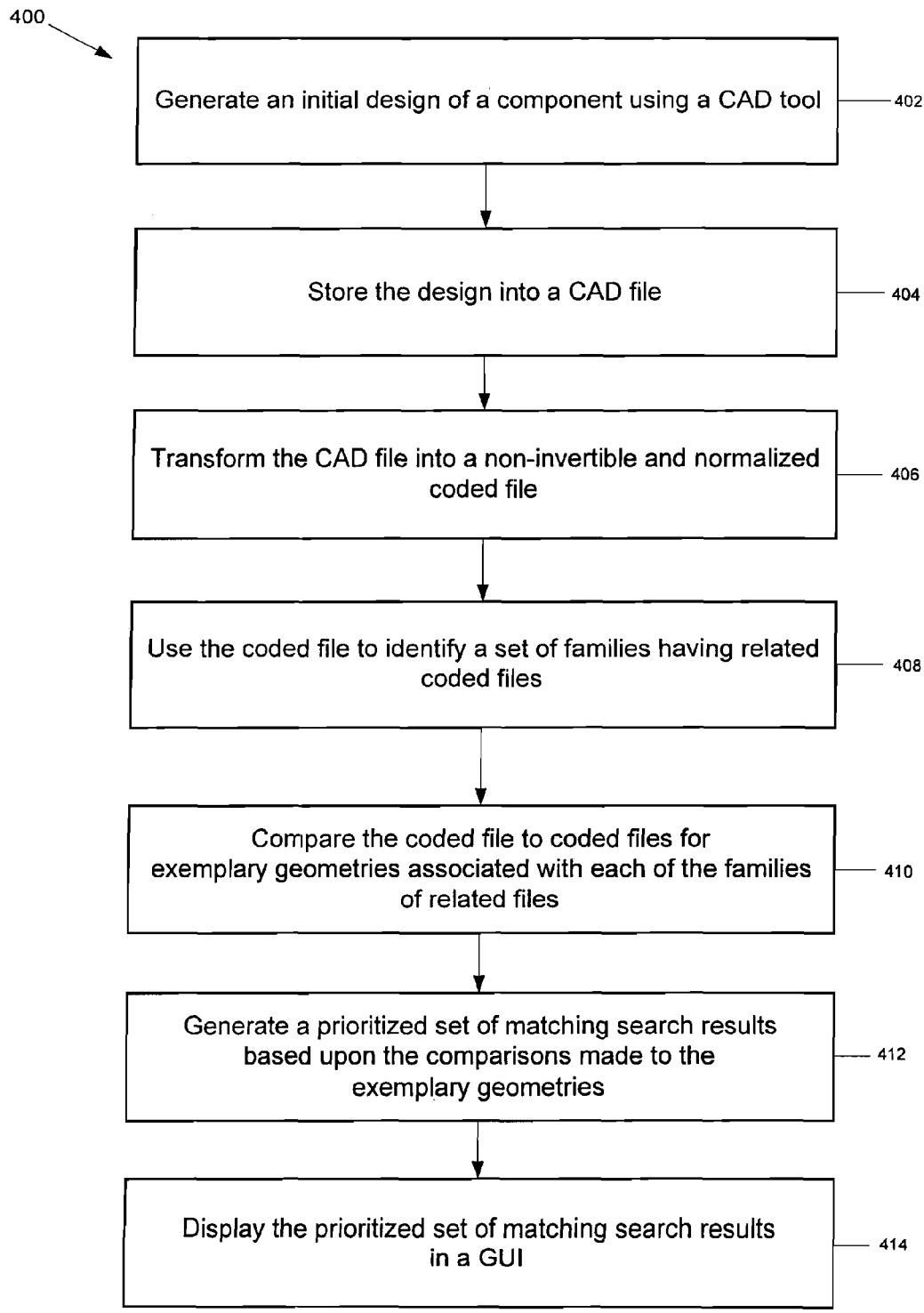
FIG. 4 is a flow diagram of a method to search for similar geometric components, according to one implementation.

FIG. 4 is a flow diagram of a method 400 to search for similar geometric components, according to one implementation. In this implementation, the client device 202B is capable of searching for similar components that are represented in coded form on the database servers 206A and 206B. In an action 402, the client device 202B generates an initial design of a component using a CAD tool program in an action 402, and stores this design in the CAD file 114 (shown in FIG. 1) in an action 404. In an action 406, the coding software 110 transforms the CAD file 114 into a non-invertible and normalized coded file in a manner similar to the way in which the coding software 104 transforms the CAD file 102A, 102B, or 102C as described above in reference to the action 306 FIG. 3A. In an action 408, the search engine software 108 uses the coded file to identify a set of families in the library 106 having related coded files, according to one implementation. In one implementation, the search database server 212 is also capable of identifying the set of families by referencing its index of coded files stored on the database servers 206A and 206B.

In an action 410, the search engine software 108 compares the coded file to coded files for representative geometries associated with each of the families of related files. The coded files for these representative geometries are stored in the library 106. The search engine software 108 uses a threshold of similarity to determine if the coded file matches any of the coded files for these representative geometries. In an action 412, the search engine software 108 generates a prioritized set of matching search results based upon the comparisons made to the representative geometries. In one implementation, the closest matches are given higher priority in the set of matching search results. In an action 414, the user software 112 displays the prioritized set of matching search results to the designer. In one implementation, the search results each include information about a component manufacturer.

Figure 5A:
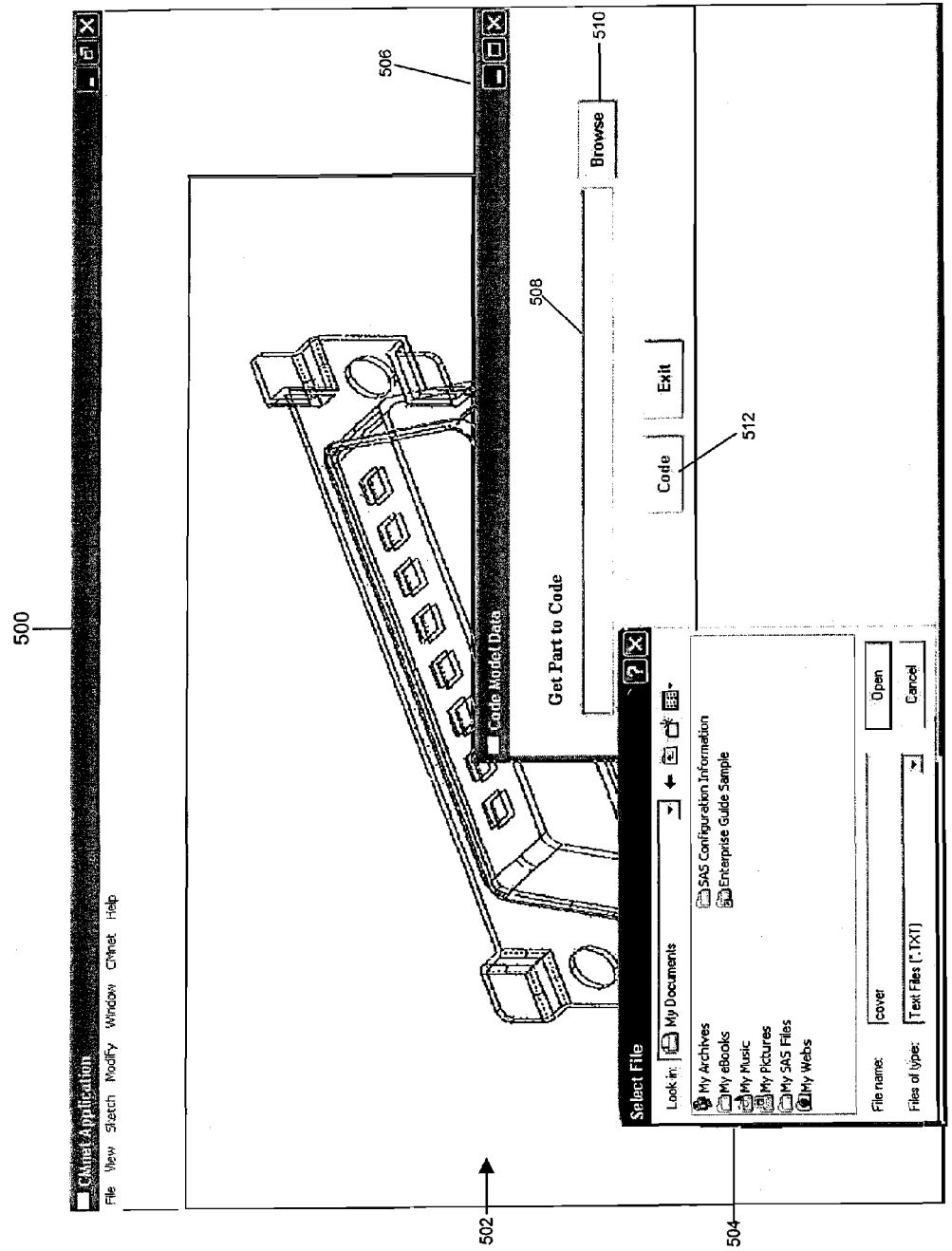

FIG. 5A through FIG. 5D are screen diagrams of windows in a graphical user interface (GUI) displayed on the client device 202B that allow a user to transform CAD files into coded files and to search for similar coded files, according to one implementation. FIG. 5A is a screen diagram of a window 500 within the GUI. The window 500 is displayed to a designer or an OEM designer on the client device 202B. The designer is able to use a CAD design tool, which may be included within the user software 112, to create a model or representation of a geometry of a component within a modeling area 502 of the window 500. As shown in the example of FIG. 5A, the designer has created a model of a mechanical interface connector, such as an RS-232 connector, within the modeling area 502. The designer then saves this model into a CAD file 114. In an alternate scenario, the designer may select a preexisting CAD file 114 that already includes a preexisting model of a geometry of a component. In this scenario, the designer uses a pop-up window 506 to specify the name of the preexisting CAD file 114. The designer may either enter the name of the CAD file 114 into a text-entry field 508 or may alternatively select a button 510 to browse for existing files.

If the designer selects the button 510, a pop-up window 504 is displayed within the GUI. By using the menus and/or text-entry fields within the pop-up window 504, the designer is able to browse through files and select the preexisting CAD file 114.

Once the designer has selected the preexisting CAD file 114, the representation of the geometry of the component contained within the CAD file 114 is displayed to the designer in the modeling area 502. Whether the designer has created or loaded the CAD file 114, the designer is able to generate a coded file by selecting a button 512. When the designer selects the button 512, the user software 112 shown in FIG. 1 provides the CAD file 114 to the coding software 110 to transform the CAD file into a non-invertible coded file.

Figure 5B:
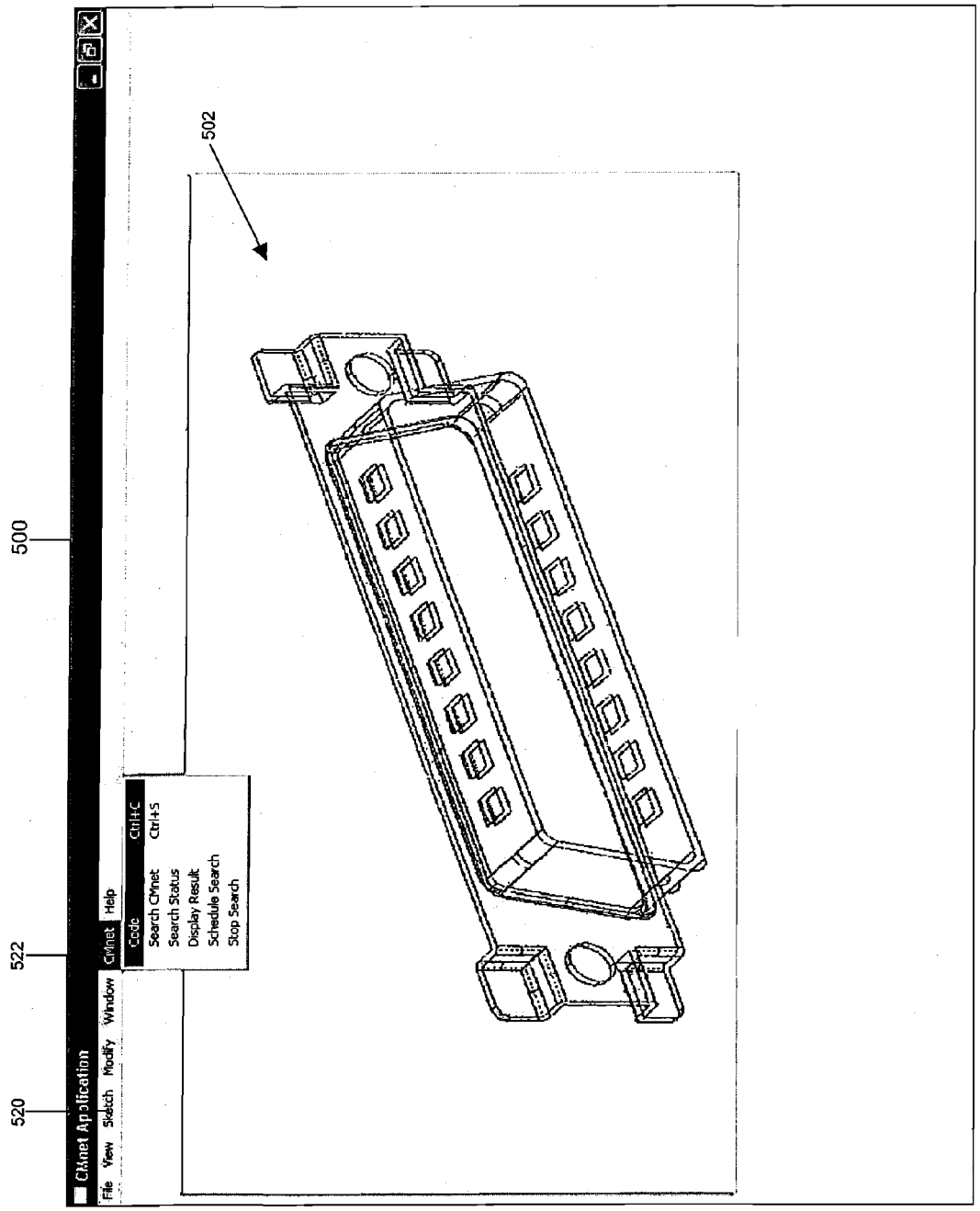

FIG. 5B is another screen diagram of the window 500 shown within the GUI. If the designer chooses to create a model within the modeling area 502 and generate the CAD file 114, the user may select an entry in a sketch menu 520. By selecting an entry in the sketch menu 520, the designer is capable of using a CAD design tool provided within the GUI to sketch a model of a component within the modeling area 502. The designer may also use the menu 522 to select various other options.

For example, the designer may select the "Code" option from the menu 522 to generate a coded representation of the model shown within the modeling area 502. When the designer selects this option, the CAD file 114 is provided to the coding software 110. The designer may also select the "Search CMnet" option (wherein "CMnet" stands for "contract manufacturing network") to search for similar coded files within the library 106. In one implementation, the coded files contained within the library 106 correspond to components modeled in the CAD files 102A, 102B, and 102C and produced by various contract manufacturers. When the designer selects this option, the search engine software 108 uses the coded file provided by the coding software 110 to search for similar coded files in the library 106.

In one implementation, the designer may use the pop-up window 530 shown in FIG. 5C to specify additional search criteria before searching for related files. These search criteria are used to supplement the information provided in the coded file relating to the component's, or product's, geometric shape. The window 530 includes a selection area 532 that contains three selection buttons. The designer may select one or more of the buttons to select specific search criteria. For example, the designer may select a "material" search criterion to limit the search to coded files in the library 106 that are associated with components made of a specific material. The designer may select a "manufacturing process" criterion to limit the search to coded files that are associated with components made by a specific manufacturing process. The designer may select a "location" criterion to limit the search to coded files that are associated with components manufactured in a specific location. The criteria selected within the selection area 532 are used by the search engine software 108, along with the coded file provided by the coding software 110, to search for similar coded files within the library 106.

In one implementation, the coded files stored in the library 106 are clustered into first-tier groups according to the criteria that may be selected by the designer, such as material type, location, and/or manufacturing process. The search engine software 108 uses the actual criteria selected by the designer to select one or more specific first-tier groups of coded files within the library 106 and then uses second- and/or lower-tier groups within the first-tier groups to match the preexisting coded files with the source file generated by the coding software 110.

In one implementation, the criteria selected by the designer are captured as meta information and used by the search engine software 108 when searching the library 106. In this implementation, meta information is also contained within the library 106 that relates to the CAD files 102A, 102B, and 102C. Both the coding software 110 and the coding software 104 are capable of generating meta information that is associated with a particular coded file. In one implementation, this meta information is not included within the coded file but is directly associated with the coded file.

The designer may use the list area 534 and the selection area 536 to specify certain attributes for a criterion selected within the selection area 532. For example, as shown in FIG. 5C, the designer has selected the "material" criterion within the selection area 532. The list area 534 provides a list of materials (with a material number and material name) that may be selected by the designer. Any number of different materials could be listed within the list area 534. The designer may select one or more of the materials from the list and select a button 538 to move these materials into the selection area 534. Once the designer has selected the button 538, the selected materials are displayed within the selection area 534. The designer may also use the button 540 to de-select materials from within the selection area 534 and move them back into the list area 534.

Once the designer has finished making selections, the designer may select a search button 542 to initiate a search. The search engine software 108 then searches the library 106 for related files. At any time, the designer may select the "Search status" option in the menu 522 (shown in FIG. 5B) to view a status of a pending search. The designer may stop a pending search by selecting the "stop search" option from the menu 522. In one implementation, any search results that have been identified by the search engine software 108 are displayed to the designer after the designer has selected the "stop search" option. The designer may also select a "Schedule search" option from the menu 522 to schedule a search on a particular day or at a particular time.

Figure 5D:
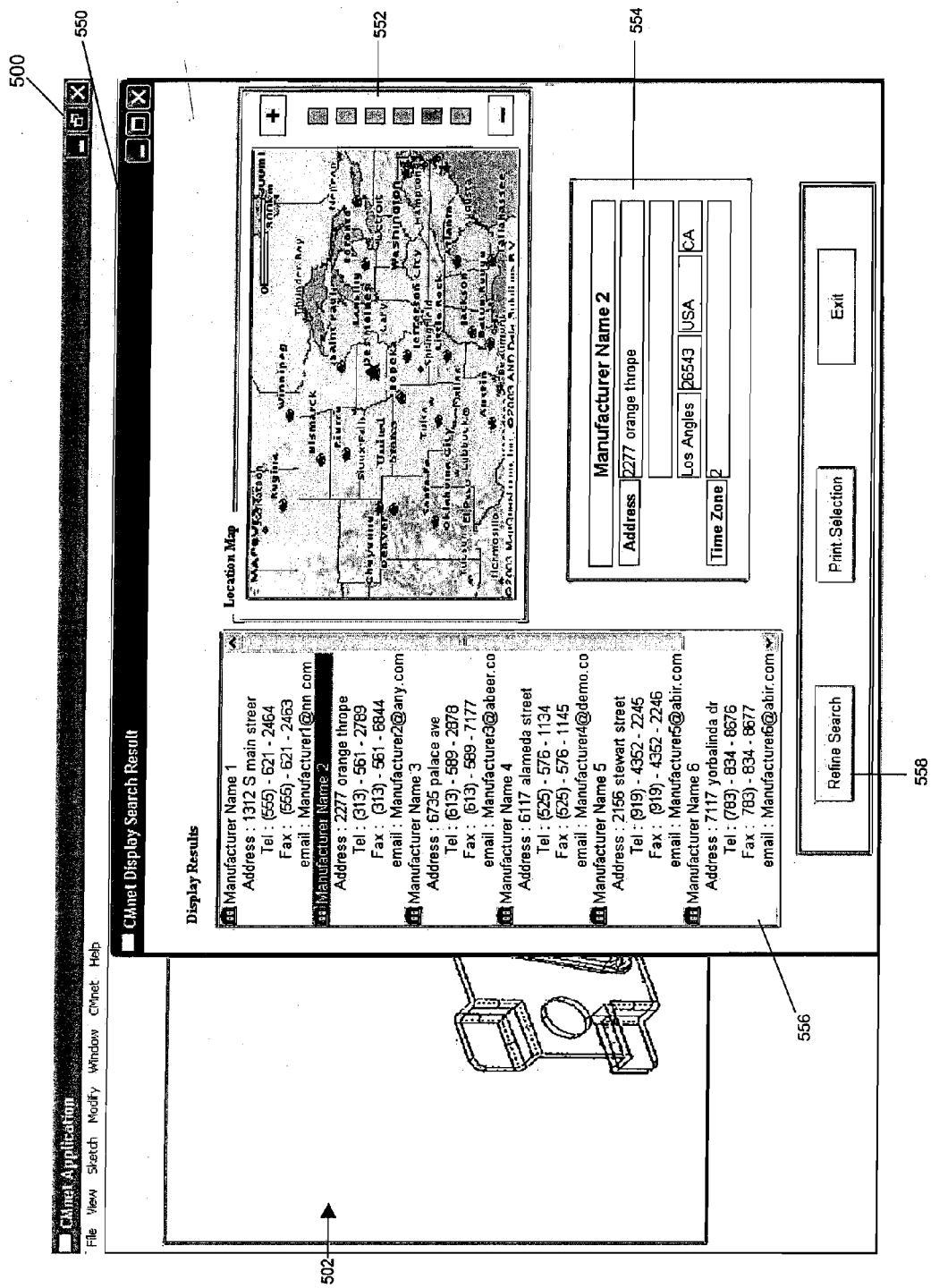

Search results are displayed to the designer within the GUI as shown in FIG. 5D. When the search engine software 108 provides a set of prioritized results back to the user software 112, the user software 112 displays these results to the designer within a pop-up window 550 shown within the GUI. The window 550 includes a results area 556, a map area 552, and a detail area 554. In one implementation, the designer is able to select the "display result" option in the menu 522 to display the search results within the window 550.

As shown in FIG. 5D, the results area 556 shows a set of search results for various manufacturers. These manufacturers have produced components whose coded representations had been stored in the library 106 and matched to a coded representation of a source component by the search engine software 108. These manufacturers had originally modeled these components in the CAD files 102A, 102B, and 102C. By viewing the results shown in the results area 556, the designer or individuals working for an OEM are able to quickly identify manufacturers who produce components similar to the one that had been modeled in the CAD file 114. An OEM may wish to contact one or more of these manufacturers to find out more about manufactured products, to purchase products, or to inquire about licensing opportunities. Each search result included within the results area 556 includes manufacturer contact information, such as business address, telephone, fax, and email information. If the designer selects one of the search results, the detailed area 554 displays detailed contact information for the given manufacturer. In one implementation, the search results shown in the results area 556 are listed in prioritized form. Those manufacturers that produce components that have matched most closely to the source component, as determined by the search engine software 108, are shown at the top of the list of search results. As shown in the example of FIG. 5D, the search engine software 108 has determined that the closest matching component is the one manufactured by "Manufacturer Name 1".

The window 550 also includes the map area 552. If the designer selects one of the search results in the results area 556, a corresponding map is displayed to the designer within the map area 552. The displayed map shows the location of the manufacturer according to the business address included within the selected search result.

In one implementation, the designer is able to refine the set of search results displayed within the results area 556. If the designer selects a button 558, the window 530 shown in FIG. 5C is again displayed to the designer. At this point, the designer is able to modify the search selection criteria. In addition, the designer may choose to modify the CAD representation of the geometry of the source component in the modeling area 502. If the designer modifies the CAD model in this fashion, the CAD file 114 is updated and re-coded by the coding software 110. The search engine software 108 is then capable of initiating a new search.

Figure 6:
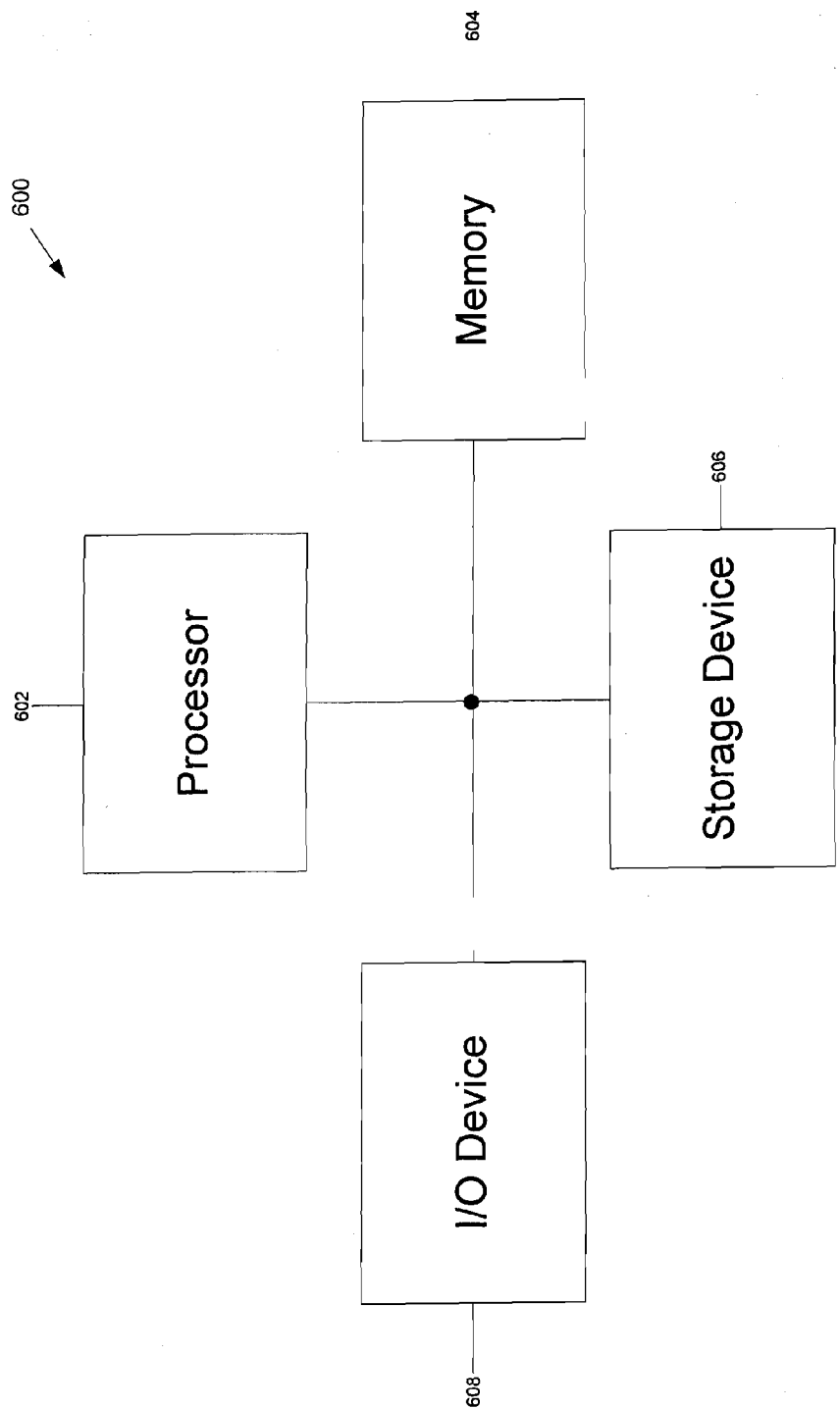
FIG. 6 is a block diagram of a computing device that may be included within the client devices and/or the server systems shown in FIG. 2.

FIG. 6 is a block diagram of a computing device 600 that may be included within the client devices and/or the server systems shown in FIG. 2. The computing device 600 includes a processor 602, a memory 604, a storage device 606, and an input/output device 608. Each of the components 602, 604, 606, and 608 are interconnected using a system bus. The processor 602 is capable of processing instructions for execution within the computing device 600. In one implementation, the processor 602 is a single-threaded processor. In another implementation, the processor 602 is a multi-threaded processor. The processor 602 is capable of processing instructions stored in the memory 604 or on the storage device 606 to display graphical information for a GUI on the input/output device 608.

The memory 604 stores information within the computing device 600. In one implementation, the memory 604 is a computer-readable medium. In one implementation, the memory 604 is a volatile memory unit. In another implementation, the memory 604 is a non-volatile memory unit.

The storage device 606 is capable of providing mass storage for the computing device 600. In one implementation, the storage device 606 is a computer-readable medium. In various different implementations, the storage device 606 may be a floppy disk device, a hard disk device, an optical disk device, or a tape device.

In one implementation, a computer program component is tangibly embodied in an information carrier. The computer program component contains instructions that, when executed, perform one or more methods, such as those described above. The information carrier is a computer- or machine-readable medium, such as the memory 604, the storage device 606, or a propagated signal.

The input/output device 608 provides input/output operations for the computing device 600. In one implementation, the input/output device 608 includes a keyboard and/or pointing device. In one implementation, the input/output device 608 includes a display unit for displaying the various GUI's shown in the preceding figures.

A number of implementations have been described. Nevertheless, it will be understood that various modifications may be made without departing from the spirit and scope of these implementations. Accordingly, other implementations are within the scope of the following claims.

What is claimed is:

1. A computer-implemented method for performing an electronic database search to identify previously designed components that are geometrically similar or identical to a source component, the method comprising:

transforming a three-dimensional model of the source component into a coded representation of the geometry of the source component, wherein the transformation is performed using a defined field generating condition that would generate a field of a defined type in a region of space, and wherein the transformation is performed using a physical property of the source component as an input to a mathematical framework based on a field theory for the defined type of field, and wherein the mathematical framework yields one or more values that describe the field generated in the region of space;

accessing an electronic database repository having stored therein multiple coded representations that each represent the geometry of a different previously designed component, each coded representation having been previously generated by transforming a three-dimensional model of the previously designed component into a coded representation of the geometry of the previously designed component using the same transformation used in transforming the three-dimensional model of the source component into the coded representation of the geometry of the source component;

comparing the coded representation of the geometry of the source component to at least one of the stored multiple coded representations that each represent the geometry of a different previously designed component, to identify at least one previously designed component that is geometrically similar or identical to the source component; and generating a search result that identifies at least one of the previously designed components that are identified in the comparison to be geometrically similar or identical to the source product.

2. The method of claim 1, wherein the coded representation of the geometry of the source component is at least partially independent of a rotation or a translation of the source component in space.

3. The method of claim 1, wherein the coded representation of the geometry of the source component is a non-invertible representation.

4. The method of claim 1, wherein comparing the coded representation of the geometry of the source component to the at least one of the stored multiple coded representations includes using a threshold of similarity to determine if the coded representation of the geometry of the source component matches a coded representation of the geometry of a previously designed component.

5. The method of claim 1, further comprising:
obtaining an additional selection criterion related to the source component; and
filtering identified previously designed components using the additional selection criterion such that the filtered components are not provided in the search result.

6. The method of claim 5, wherein the additional selection criterion is a manufacturing process criterion.

7. The method of claim 1, further comprising displaying the search result to a user.

8. The method of claim 7, wherein for one previously designed component identified in the search result there is included a name of a manufacturer of the one previously designed component.

9. The method of claim 8, wherein for the one previously designed component identified in the search result there is further included an address and a telephone number of the manufacturer.

10. The method of claim 1, wherein the geometry of the source component includes a shape and a size of the source component.

11. The method of claim 1, wherein the three-dimensional model of the source component comprises a computer-aided design (CAD) model.

12. The method of claim 1, wherein generating the search result includes prioritizing the identified previously designed components based on their degree of similarity.

13. The method of claim 1, wherein the comparing includes determining whether the coded representations of the source component and a previously designed component satisfy a defined threshold of similarity.

14. The method of claim 1, wherein the defined type of field is an electrostatic field.

15. The method of claim 14, wherein the defined field generating condition is an electrostatic charge uniformly distributed on the entire surface of the source component.

16. The method of claim 15, wherein the mathematical framework based on a field theory for a field of the defined type is a boundary value problem.

17. The method of claim 16, wherein the mathematical framework based on a field theory for a field of the defined type comprises Poisson's equation.

18. The method of claim 17, wherein the one or more values that describe the generated field comprises one or more coefficients of a series expansion.

19. The method of claim 15, wherein the input of the physical property of the source component comprises data that defines the surfaces of the source component.

20. The method of claim 19, wherein the mathematical framework based on a field theory for a field of the defined type is a boundary value problem.

21. The method of claim 20, wherein the mathematical framework based on a field theory for a field of the defined type comprises Poisson's equation.

22. The method of claim 21, wherein the one or more values that describe the generated field comprises one or more coefficients of a series expansion.

23. The method of claim 20, wherein the one or more values that describe the generated field comprises one or more coefficients of a series expansion.

24. The method of claim 1, wherein the mathematical framework based on a field theory for a field of the defined type is a boundary value problem.

25. The method of claim 24, wherein the mathematical framework based on a field theory for a field of the defined type comprises Poisson's equation.

26. The method of claim 24, wherein the one or more values that describe the generated field comprises one or more coefficients of a series expansion.

27. The method of claim 1, wherein the input of the physical property of the source component comprises data that defines the surfaces of the source component.

28. The method of claim 1, wherein the region of space comprises at least a region of space that surrounds the component.

29. A computer program product tangibly embodied in computer storage memory, the computer program product including instructions that, when executed by a processor, perform a computer-implemented method for performing a database search to identify previously designed components that are geometrically similar or identical to a source component, the computer-implemented method comprising:
    transforming a three-dimensional model of the source component into a coded representation of the geometry of the source component, wherein the transformation is performed using a defined field generating condition that would generate a field of a defined type in a region of space, and wherein the transformation is performed using a physical property of the source component as an input to a mathematical framework based on a field theory for the defined type of field, and wherein the mathematical framework yields one or more values that describe the field generated in the region of space;
    accessing an electronic database repository having stored therein multiple coded representations that each represent the geometry of a different previously designed component, each coded representation having been previously generated by transforming a three-dimensional model of the previously designed component into a coded representation of the geometry of the previously designed component using the same transformation used in transforming the three-dimensional model of the source component into the coded representation of the geometry of the source component;
    comparing the coded representation of the geometry of the source component to at least one of the stored multiple coded representations that each represent the geometry of a different previously designed component, to identify at least one previously designed component that is geometrically similar or identical to the source component; and
    generating a search result that identifies at least one of the previously designed components that are identified in the comparison to be geometrically similar or identical to the source product.

30. The computer program product of claim 29, wherein the coded representation of the geometry of the source component is at least partially independent of a rotation or a translation of the source component in space.

31. The computer program product of claim 29, wherein the coded representation of the geometry of the source component is a non-invertible representation.

32. The computer program product of claim 29, wherein comparing the coded representation of the geometry of the source component to the at least one of the stored multiple coded representations includes using a threshold of similarity to determine if the coded representation of the geometry of the source component matches a coded representation of the geometry of a previously designed component.

33. The computer program product of claim 29, wherein the method further comprises:
    obtaining an additional selection criterion related to the source component; and
    filtering identified previously designed components using the additional selection criterion such that the filtered components are not provided in the search result.

34. The computer program product of claim 33, wherein the additional selection criterion is a manufacturing process criterion.

35. The computer program product of claim 29, wherein the method further comprises displaying the search result to a user.

36. The computer program product of claim 35, wherein for one previously designed component identified in the search result there is included a name of a manufacturer of the one previously designed component.

37. The computer program product of claim 36, wherein for the one previously designed component identified in the search result there is further included an address and a telephone number of the manufacturer.

38. The computer program product of claim 29, wherein the geometry of the source component includes a shape and a size of the source component.

39. The computer program product of claim 29, wherein the three-dimensional model of the source component comprises a computer-aided design (CAD) model.

40. The computer program product of claim 29, wherein generating the search result includes prioritizing the identified previously designed components based on their degree of similarity.

41. The computer program product of claim 29, wherein the comparing includes determining whether the coded representations of the source component and a previously designed component satisfy a defined threshold of similarity.

42. A system to provide search results associated with previously designed components having geometries that are similar to a geometry of a source component, the system being programmed to:
    transform a three-dimensional model of the source component into a coded representation of the geometry of the source component, wherein the transformation is performed using a defined field generating condition that would generate a field of a defined type in a region of space, and wherein the transformation is performed using a physical property of the source component as an input to a mathematical framework based on a field theory for the defined type of field, and wherein the mathematical framework yields one or more values that describe the field generated in the region of space;
    access an electronic database repository having stored therein multiple coded representations that each represent the geometry of a different previously designed component, each coded representation having been previously generated by transforming a three-dimensional model of the previously designed component into a coded representation of the geometry of the previously designed component using the same transformation used in transforming the three-dimensional model of the source component into the coded representation of the geometry of the source component;

compare the coded representation of the geometry of the source component to at least one of the stored multiple coded representations that each represent the geometry of a different previously designed component, to identify at least one previously designed component that is geometrically similar or identical to the source component; and generate a search result that identifies at least one of the previously designed components that are identified in the comparison to be geometrically similar or identical to the source product.

43. A system to provide search results associated with previously designed components having geometries that are similar to a geometry of a source component, the system comprising:

means for transforming a three-dimensional model of the source component into a coded representation of the geometry of the source component, wherein the transformation is performed using a defined field generating condition that would generate a field of a defined type in a region of space, and wherein the transformation is performed using a physical property of the source component as an input to a mathematical framework based on a field theory for the defined type of field, and wherein the mathematical framework yields one or more values that describe the field generated in the region of space;

means for accessing an electronic database repository having stored therein multiple coded representations that each represent the geometry of a different previously designed component, each coded representation having been previously generated by transforming a three-dimensional model of the previously designed component into a coded representation of the geometry of the previously designed component using the same transformation used in transforming the three-dimensional model of the source component into the coded representation of the geometry of the source component;

means for comparing the coded representation of the geometry of the source component to at least one of the stored multiple coded representations that each represent the geometry of a different previously designed component, to identify at least one previously designed component that is geometrically similar or identical to the source component; and means for generating a search result that identifies at least one of the previously designed components that are identified in the comparison to be geometrically similar or identical to the source product.

* * * * *